(12) United States Patent
Hsia et al.

(10) Patent No.: US 8,284,628 B2
(45) Date of Patent: Oct. 9, 2012

(54) VOLTAGE REGULATOR FOR MEMORY

(75) Inventors: Chun-Ching Hsia, Hualien County (TW); Yen-An Chang, Miaoli County (TW); Der-Min Yuan, Taipei County (TW)

(73) Assignee: Etron Technology, Inc., Hsinchu (TW)

( * ) Notice: Subject to any disclaimer, the term of this patent is extended or adjusted under 35 U.S.C. 154(b) by 137 days.

(21) Appl. No.: 13/024,301

(22) Filed: Feb. 9, 2011

(65) Prior Publication Data

US 2012/0063254 A1    Mar. 15, 2012

(30) Foreign Application Priority Data

Sep. 10, 2010 (TW) .............................. 99130629 A

(51) Int. Cl.
*G11C 5/14* (2006.01)

(52) U.S. Cl. .................. 365/226; 365/189.09; 365/211; 365/233.1

(58) Field of Classification Search ............... 365/226, 365/189.09, 211, 233.1
See application file for complete search history.

(56) References Cited

U.S. PATENT DOCUMENTS

| | | | | |
|---|---|---|---|---|
| 6,072,742 A * | 6/2000 | Ooishi | ............ | 365/226 |
| 6,351,426 B1 * | 2/2002 | Ohsawa | ............ | 365/226 |
| 7,432,758 B2 * | 10/2008 | Chou et al. | ............ | 327/540 |
| 7,577,043 B2 * | 8/2009 | Chou et al. | ............ | 365/189.09 |

* cited by examiner

*Primary Examiner* — Pho M Luu
(74) *Attorney, Agent, or Firm* — Winston Hsu; Scott Margo

(57) ABSTRACT

A voltage regulator includes a first transistor, a second transistor, a third transistor, a feedback unit, a comparison unit, a first control unit and a second control unit. The first transistor is controlled by the feedback unit and the comparison unit, for stabilizing the voltage of the output node. When the first control unit turns on the second transistor, the voltage of the output node rises. When the first control unit turns off the second transistor, it triggers the second control unit turning on the third transistor, so the first transistor is turned on completely. Therefore, when the third transistor is turned off, the first transistor can be controlled by the feedback unit and the comparison unit for stabilizing the voltage of the output node.

13 Claims, 6 Drawing Sheets

VOLTAGE REGULATOR FOR MEMORY

BACKGROUND OF THE INVENTION

1. Field of the Invention

The present invention is related to a voltage regulator for a memory, and more particularly, to a voltage regulator for a memory capable of stabilizing output voltages.

2. Description of the Prior Art

While semiconductor technology continuously reduces size to achieve bigger storage, a voltage regulator on a chip has to be able to provide lower supply voltage to an inner circuit in order to increase reliability and reducing power consumption of memory. For bit-line sensing in dynamic random access memory (DRAM), both recovery and pre-charge of a memory unit array consume current abruptly and severely. Therefore, devising a voltage regulator on a chip provides stable voltage level with sufficient and proper supply current to the memory unit array.

Please refer to FIG. 1, which illustrates a schematic diagram of a voltage regulator for memory according to the prior art. A voltage regulator 100 includes a first transistor 111, a second transistor 112, an inductor 151, a digital boosting control circuit and an analog boosting control circuit. The digital boosting control circuit includes a first control unit 141. The analog boosting control circuit includes a third transistor 113, a feedback unit 120, a comparison unit 130 and a second control unit 142. A first end of the inductor 151 is electrically connected to a voltage source VDD, and a second end of the inductor 151 is electrically connected to an input node N1. The first transistor 111 is a P-type Metal Oxide Semiconductor (PMOS) transistor. A first end of the first transistor 111 is electrically connected to the input node N1, a second end of the first transistor 111 is electrically connected to an output node N2, and a control end of the first transistor 111 is electrically connected to the comparison unit 130. The second transistor 112 is a PMOS transistor. A first end of the second transistor 112 is electrically connected to the input node N1, a second end of the second transistor 112 is electrically connected to the output node N2, and a control end of the second transistor 112 is electrically connected to the first control unit 141. The third transistor 113 is an N-type Metal Oxide Semiconductor (NMOS) transistor. A first end of the third transistor 113 is electrically connected to the control end of the first transistor 113, a second end of the third transistor 113 is electrically connected to a ground end, and a control end of the third transistor 113 is electrically connected to the second control unit 142. The feedback unit 120 includes resistors 121 and 122. Voltage VCCSA at the output node N2 can generate a feedback signal VFB via the resistors 121 and 122. The comparison unit 130 includes an operational amplifier 131. The comparison unit 110 compares the feedback signal VFB with a reference voltage REF to generate a control signal PDRV_ACT for controlling the first transistor 111, to stabilize the voltage VCCSA at the output node N2. The output node N2 of the voltage regulator 100 is electrically connected to the sensing amplifier 160 of the memory, for providing the stabilized voltage VCCSA. The inductor 152 is electrically connected to the sensing amplifier 160. The first control unit 141 generates a first control signal A for controlling the second transistor 112 according to an input signal IN, and the second control unit 142 generates a second control signal B for controlling the third transistor 113 according to the input signal IN.

Please refer to FIG. 2, which illustrates a schematic diagram of operation waveforms shown in FIG. 1. The first control unit 141 generates the first control signal A according to the input signal IN. When the input signal IN rises from a low level L to a high level H, the first control signal A drops from the high level H to the low level L, which turns on the second transistor 112. Meanwhile, current flows from the input node N1 to the output node N2 via the second transistor 112, and thus the voltage VDDSA at the input node N1 drops, the voltage VCCSA at the output node N2 rises. The second control unit 142 generates the second control signal B according to the input signal IN. When the first control signal A is at the low level L, the second control signal B turns on the third transistor 113, such that the control end of first transistor 111 is electrically connected to the ground end. Therefore the control signal PDRV_ACT is pulled to the low level L, while the first transistor 111 is fully turned on. When the third transistor 113 is turned off, the control signal PDRV_ACT is determined by the comparison unit 110. However, the control signal PDRV_ACT changes according to the voltage VCCSA at the node N2. Hence, when the signal A changes, oscillation may occur on the voltage VDDSA at the node N1, causing current dis-continuousity, and the voltage VCCSA at the output node N2 may become higher and higher, or a high voltage drop may be generated at the output node N2. Besides, improperly design of the size of the second transistor 112 or signal widths of the control signal A and B can also cause the discontinuity of the current. As can be seen from the above, the voltage regulator 100 of the prior art mainly initiates the analog boosting control circuit and the digital boosting control circuit at the same time. However, at high voltages, with the driving of the digital boosting control circuit, pulse width may be too long, which causes feedback failure, generating the oscillations.

SUMMARY OF THE INVENTION

It is therefore a primary objective of the present invention to provide voltage regulator for memory.

The present invention discloses a voltage regulator for memory, which comprises a first transistor, having a first end electrically connected to an input node, a second end electrically connected to an output node, and a control end; a feedback unit, electrically connected to the output node; a comparison unit, having a first input end electrically connected to the feedback unit, a second input end for receiving a reference voltage, and an output end electrically connected to the control end of the first transistor; a second transistor, having a first end electrically connected to the input node, a second end electrically connected to the output node, and a control end; a first control unit, electrically connected to the control end of the second transistor, for generating a first control signal to control the second transistor according to an input signal; a third transistor, having a first end electrically connected to the control end of the first transistor, a second end electrically connected to a ground end, and a control end; and a second control unit, electrically connected to the control end of the third transistor, for generating a second control signal to control the third transistor according to the first control signal.

The present invention further discloses a voltage regulator for memory, which comprises a first transistor, having a first end electrically connected to an input node, a second end electrically connected to an output node, and a control end, the input node electrically connected to a voltage source; a second transistor, having a first end electrically connected to the input node, a second end electrically connected to the output node, and a control end; a digital boosting control circuit, electrically connected to the control end of the second transistor, to control the second transistor according to a first input signal; and an analog boosting control circuit, electrically connected to the control end and the output node of the first transistor, to control the first transistor according to a second input signal and a voltage of the output node. The analog boosting control circuit controls the first transistor according to the second input signal and the voltage of the output node a predetermined time after the digital boosting control circuit turns on the second transistor according to the first input signal and then the digital boosting control circuit turns off the second transistor so that a voltage of the control end of the first transistor inclines to a first voltage level after the second input signal is triggered and to a second voltage level after the second transistor is turned off.

These and other objectives of the present invention will no doubt become obvious to those of ordinary skill in the art after reading the following detailed description of the preferred embodiment that is illustrated in the various figures and drawings.

DETAILED DESCRIPTION

A voltage regulator of the present invention keeps current flowing continuously to avoid problems in the prior art by initiating a digital boosting control circuit prior to initiating an analog boosting control circuit.

Figure 1:
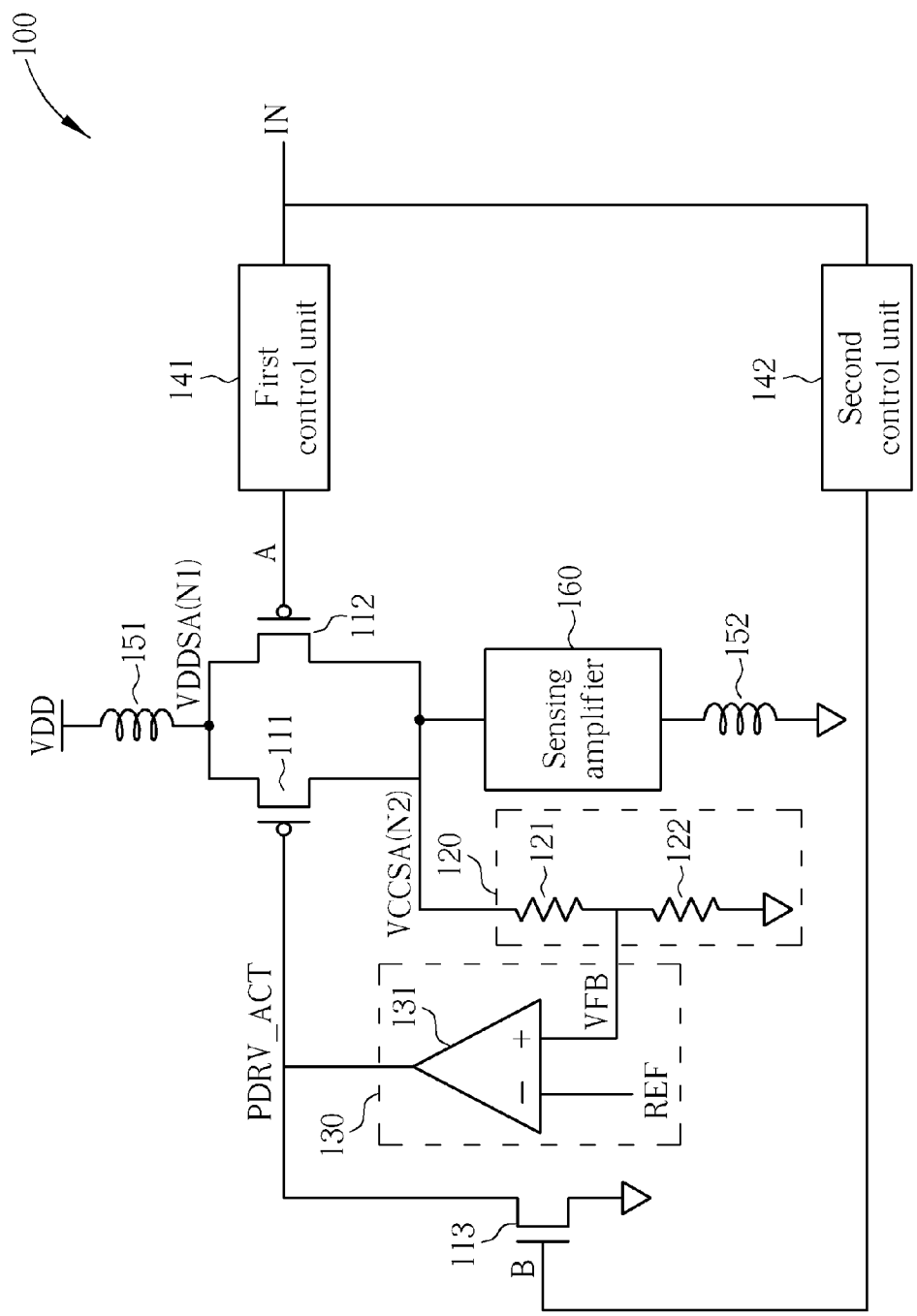
FIG. 1 is a schematic diagram of a voltage regulator for memory according to prior arts.
Figure 2:
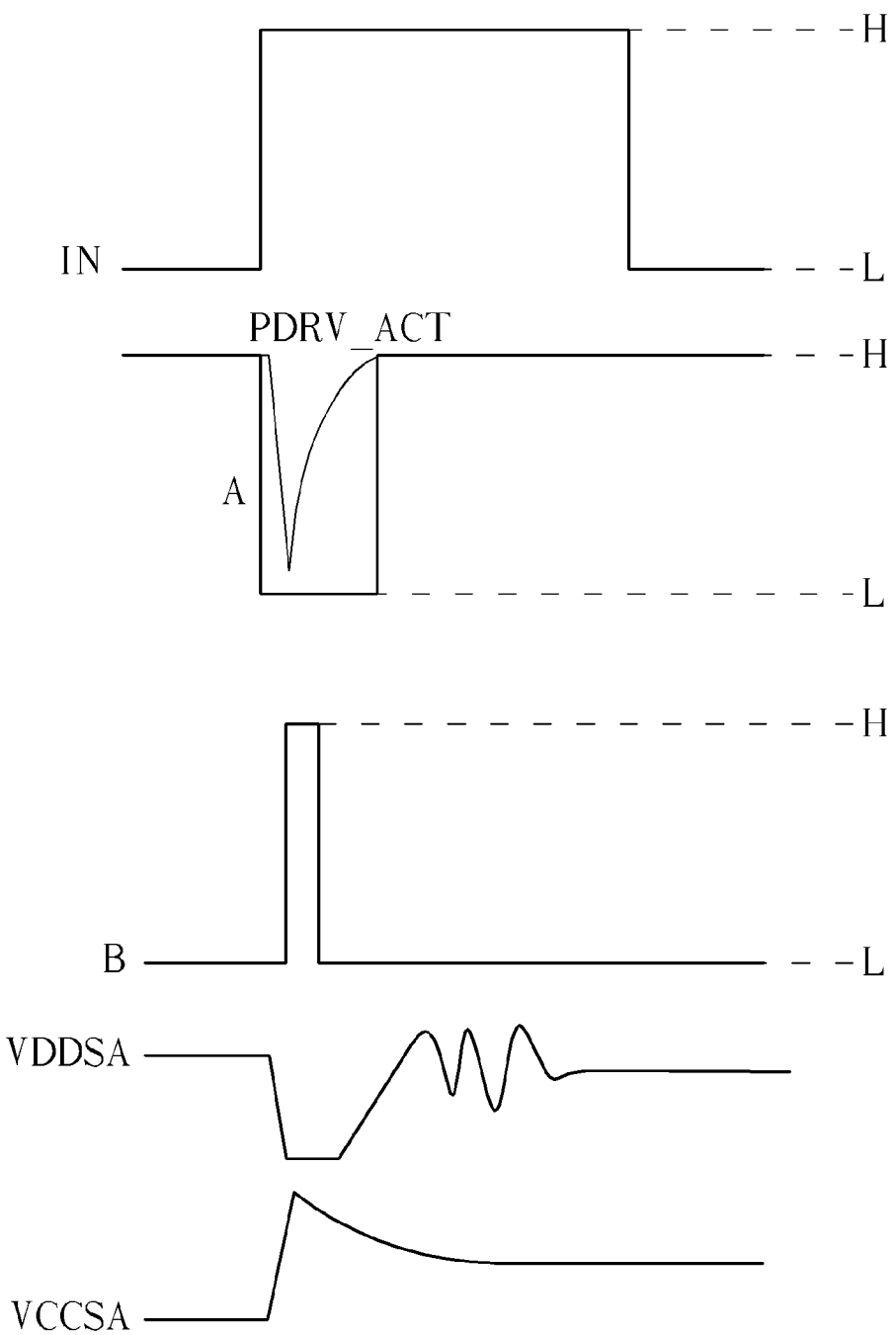
FIG. 2 is a schematic diagram of operation waveforms shown in FIG. 1.
Figure 3:
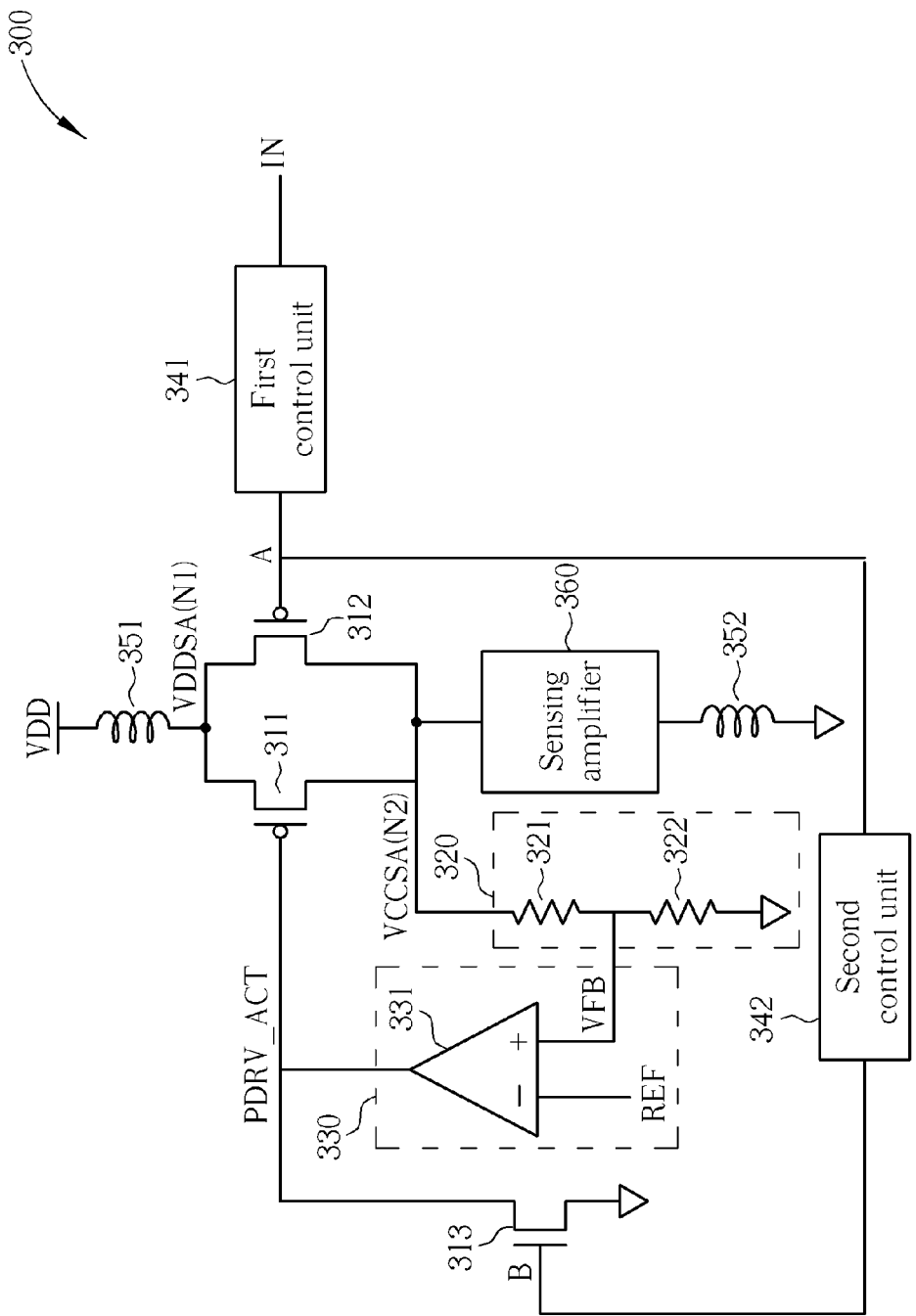
FIG. 3 is a schematic diagram of a voltage regulator for memory according to a first embodiment of the present invention.

Please refer to FIG. 3, which illustrates a schematic diagram of a voltage regulator for memory according to a first embodiment of the present invention. A voltage regulator 300 includes a first transistor 311, a second transistor 312, an inductor 351, a digital boosting control circuit and an analog boosting control circuit. The digital boosting control circuit includes a first control unit 341, and the analog digital boosting control circuit includes a third transistor 313, a feedback unit 320, a comparison unit 330 and a second control unit 342. A first end of the inductor 351 is electrically connected to voltage source VDD, and a second end of the inductor 351 is electrically connected to an input node N1. The first transistor 311 is a PMOS transistor. A first end of the first transistor 311 is electrically connected to the input node N1, a second end of the first transistor 311 is electrically connected to an output node N2, and a control end of the first transistor 311 is electrically connected to the comparison unit 330. The second transistor 312 is a PMOS transistor. A first end of the second transistor 312 is electrically connected to the input node N1, a second end of the second transistor 312 is electrically connected to the output node N2, and a control end of the second transistor 312 is electrically connected to first control unit 341. The third transistor 313 is an NMOS transistor. A first end of the third transistor 313 is electrically connected to the control end of the first transistor 311, a second end of the third transistor 313 is electrically connected to a ground end, and a control end of the third transistor 313 is electrically connected to the second control unit 342. The feedback unit 320 includes a resistor 321 and a resistor 322. The feedback signal VFB is generated by the resistors 321 and 322 according to the voltage VCCSA at the output node N2. The comparison unit 330 includes an operational amplifier 331. The comparison unit 330 compares the feedback signal VFB with a reference voltage REF to generate a control signal PDRV_ACT for controlling the first transistor 311, to stabilize the voltage VCCSA at the output node N2. The output node N2 of the voltage regulator 300 is electrically connected to a sensing amplifier 360 of the memory, for providing the stabilized voltage VCCSA. An inductor 352 is electrically connected to the sensing amplifier 360. In the embodiment, the first control unit 341 generates the first control signal A to control the second transistor 312 according to the input signal IN. The second control unit 342 generates the second control signal B to control the third transistor 313 according to the first control signal A.

Figure 4:
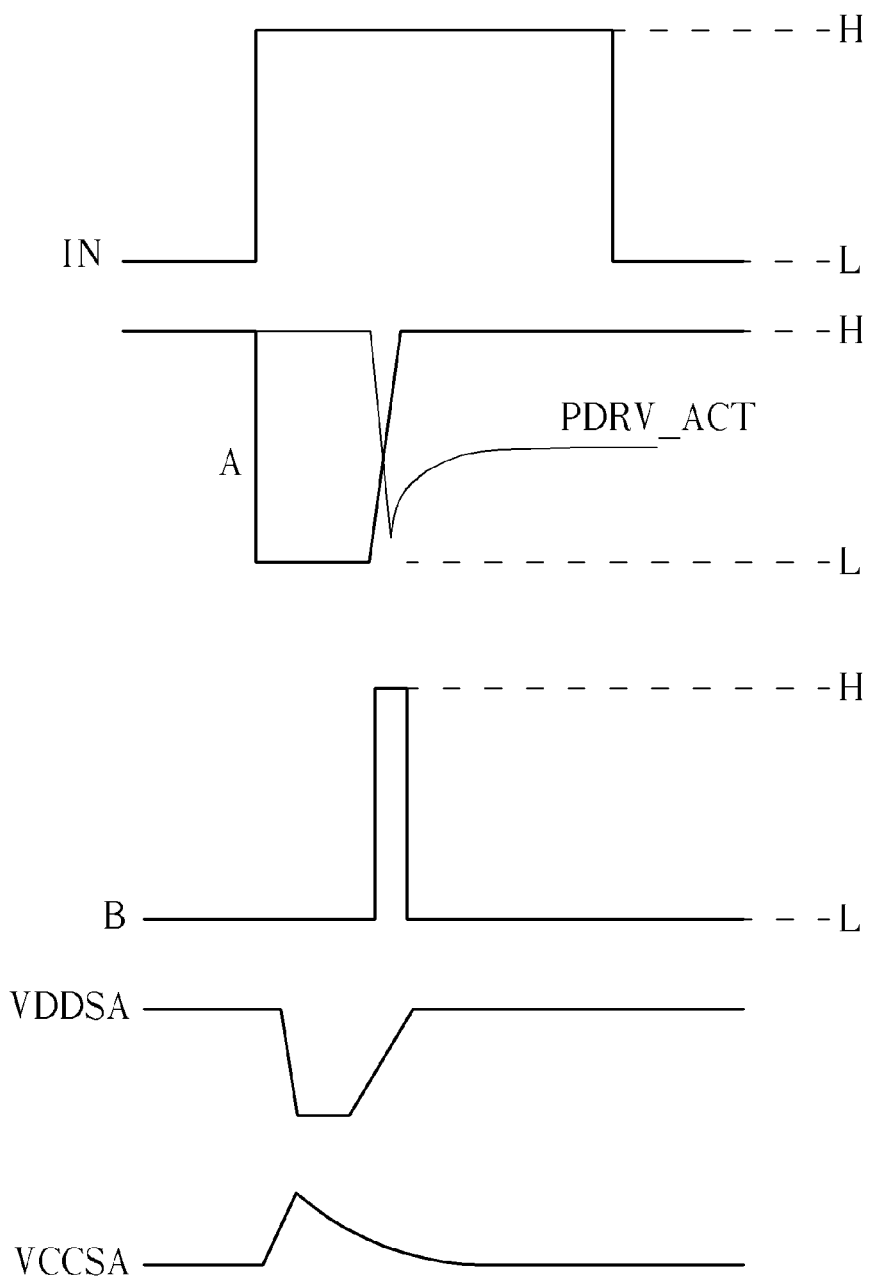
FIG. 4 is a schematic diagram of operation waveforms shown in FIG. 3.

Please refer to FIG. 4, which illustrates a schematic diagram of operation waveforms shown in FIG. 3. The first control unit 341 generates the first control signal A according to input signal IN. When the input signal IN rises from a low level L to a high level H, the first control signal A drops from the high level H to the low level L, which turns on the second transistor 312, meanwhile current flows from the input node N1 to the output node N2 via the second transistor 312, and thus voltage VDDSA at the input node N1 drops, but the voltage VCCSA at the output node N2 rises. The second control unit 342 generates the second control signal B according to the first control signal A. When the first control signal A rises from the low level L to the high level H, the second control signal B rises from the low level L to the high level H, which turns on the third transistor 313, such that the control end of the first transistor 311 is electrically connected to the ground end, and thus the control signal PDRV_ACT is pulled to the low level L, and the first transistor 311 is fully turned on consequently. When the third transistor 313 is turned off, the control signal PDRV_ACT is determined by the comparison unit 330. The control signal PDRV_ACT does not rise back to the high level H since the second transistor 312 is turned off, and the control signal PDRV_ACT turns on the first transistor 311 partially according to the feedback unit 320, so as to generate the stabilized voltage VCCSA. Namely, when the digital boosting control circuit turns on the second transistor 312 according to the first control signal A for a predetermined period of time, the analog boosting control circuit controls the first transistor 311 according to the second control signal B and the voltage VCCSA at the node N2. Then the digital boosting control circuit turns off the second transistor 312, such that voltage at the control end of the first transistor 311 inclines to the low level L after the second control signal B is triggered and inclines to the high level H after the second transistor 312 is turned off. In the embodiment, the second control signal B is triggered by the first control signal A. The first control signal A rises from the low level L to the high level H in a slope, such that the second transistor 312 is turned off after the third transistor 313 is turned on. Since the control signal PDRV_ACT is not pulled to the high level H, oscillation does not occur on the voltage VDDSA at the input node N1, and the voltage VCCSA of the output node N2 can be stabilized by the control signal PDRV_ACT as well.

Figure 5:
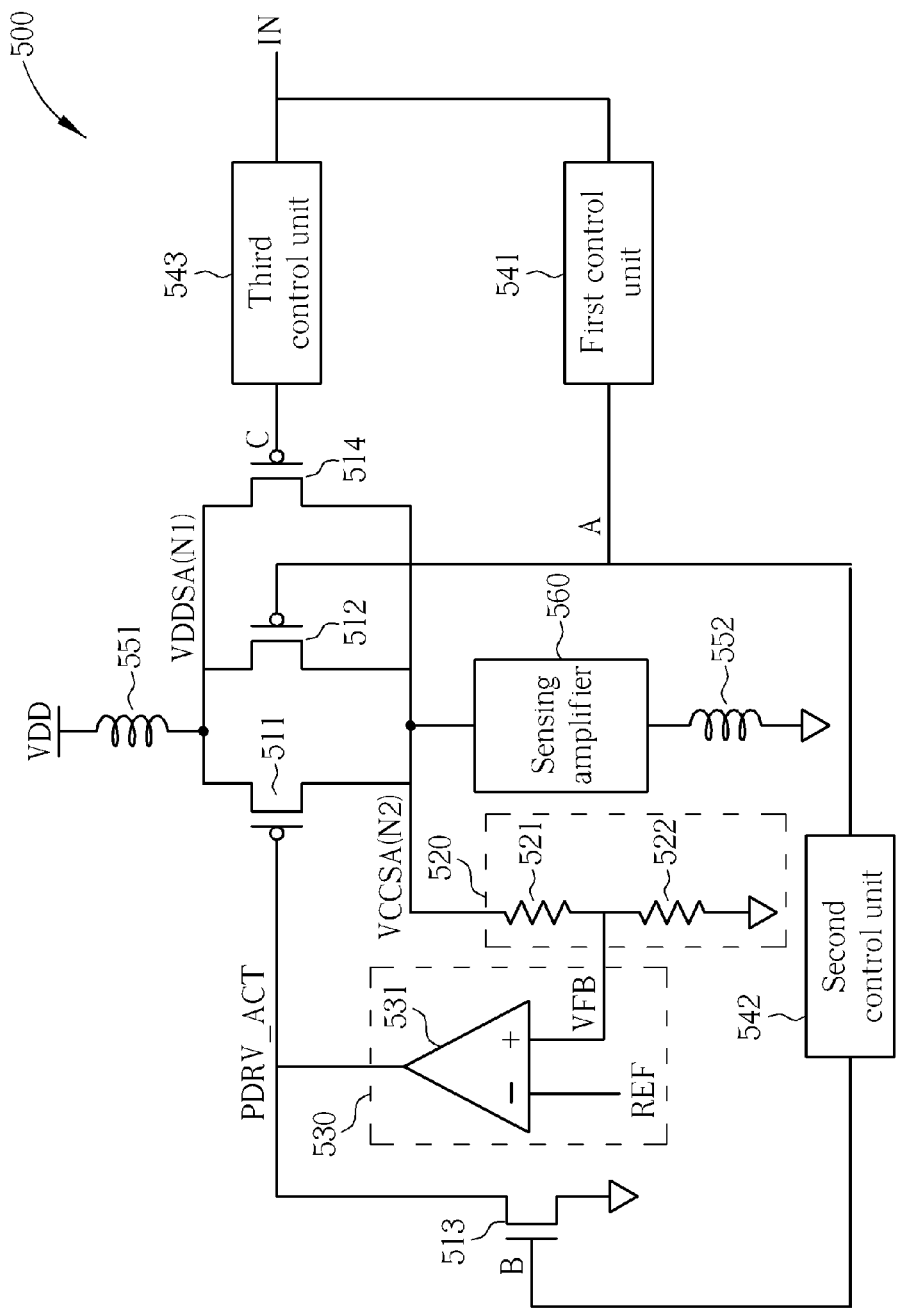
FIG. 5 is a schematic diagram of a voltage regulator for memory according to a second embodiment of the present invention.

Please refer to FIG. 5, which illustrates a schematic diagram of the voltage regulator for the memory according to a second embodiment of the present invention. A voltage regulator 500 includes a first transistor 511, a second transistor 515, a third transistor 513, a fourth transistor 514, a feedback unit 520, a comparison unit 530, a first control unit 541, a second control unit 542, a third control unit 543 and an inductor 551. In the embodiment, the voltage regulator 500 is added with the fourth transistor 514 and the third control unit 543, and the rest of the circuit is identical to the first embodiment. A first end of the fourth transistor 514 is electrically connected to the input node N1, a second end of the fourth transistor 514 is electrically connected to the output node N2, and a control end of the fourth transistor 514 is electrically connected to the third control unit 543. The third control unit 343 generates a third control signal C to control the fourth transistor 514 according to the input signal IN. When the first control signal A turns on the second transistor 512, the third control signal C turns on fourth transistor 514 at the same time, but the third control signal C turns off the fourth transistor 514 a predetermined period of time X after the first control signal A turns off second transistor 512.

Figure 6:
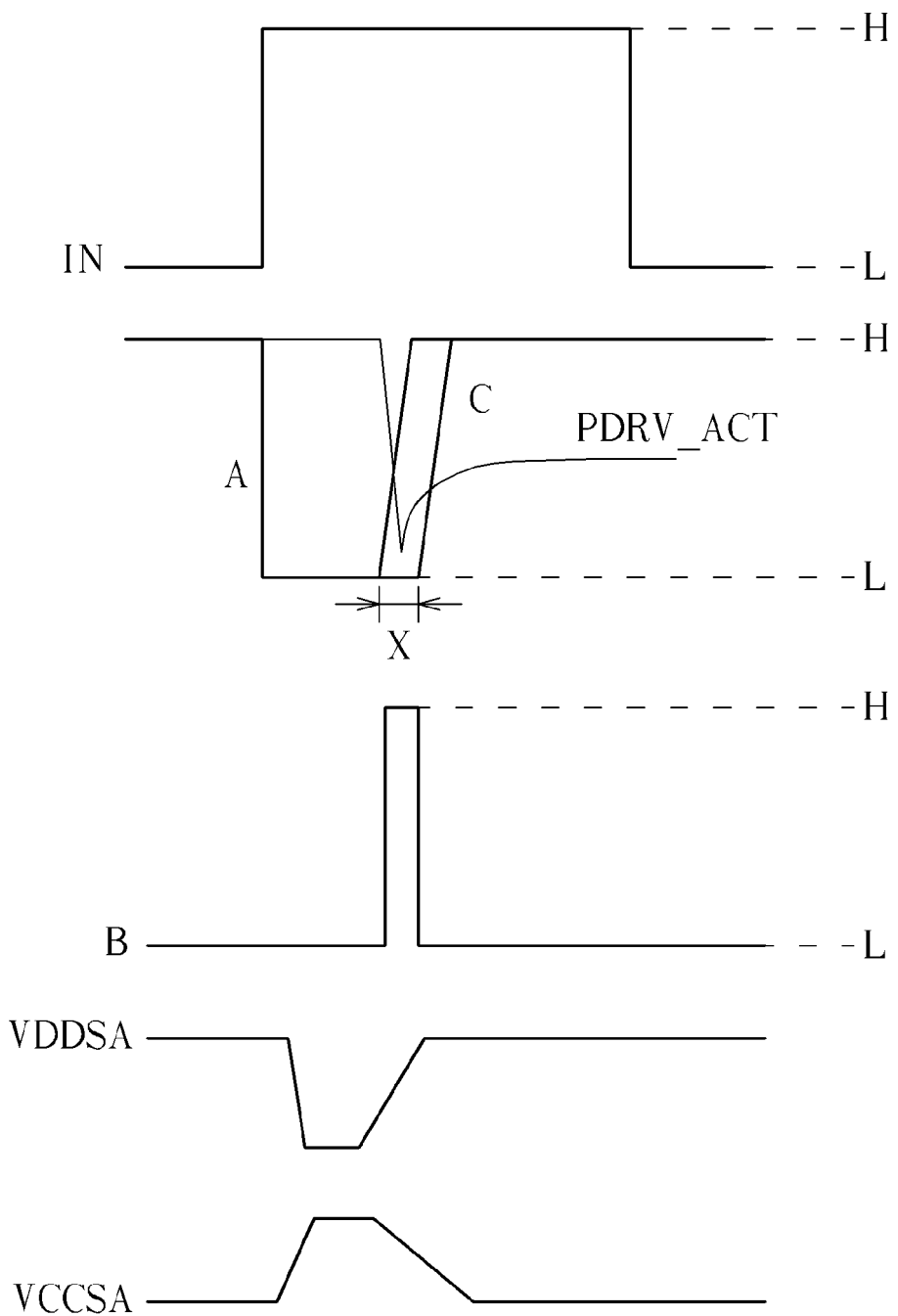
FIG. 6 is a schematic diagram of operation waveforms shown in FIG. 5.

Please refer to FIG. 6, which illustrates a schematic diagram of operation waveforms shown in FIG. 5. When the input signal IN rises from the low level L to the high level H, the first control signal A and the third control signal C drops from the high level H to the low level L at the same time, which turns on the second transistor 512 and the fourth transistor 514 respectively, meanwhile the current flows from the input node N1 to the output node N2 via the second transistor 512 and the fourth transistor 514, thus the voltage VDDSA at the input node N1 drops, and the voltage VCCSA at the output node N2 rises. The second control unit 542 generates the second control signal B according to first control signal A. When the first control signal A rises from the low level L to the high level H, the second control signal B rises from the low level L to the high level H, which turns on the third transistor 513, such that the control end of the first transistor 311 is electrically connected to the ground end, thus the control signal PDRV_ACT is pulled to the low level L, and the first transistor 511 is fully turned on. When the third transistor 513 is turned off prior to the third control signal C turns off fourth transistor 514, the control signal PDRV_ACT can be pulled up more rapidly by controlling the predetermined period of time X. Then, the control signal PDRV_ACT turns on the first transistor 511 partially according to the feedback unit 520 to generate the stabilized voltage VCCSA. In the embodiment, the second control signal B is triggered by the first control signal A. The first control signal A rises from the low level L to the high level H in the slope, such that the second transistor 512 is turned off after the third transistor 513 is turned on. In addition, the third control signal C is triggered after the third transistor 513 is turned off, the third control signal also rises from the low level L to the high level H in a slope, so as to pull up the control signal PDRV_ACT more rapidly.

To sum up, the present invention provides a voltage regulator for memory. The voltage regulator includes a first transistor, a second transistor, a third transistor, a feedback unit, a comparison unit, a first control unit and a second control unit. The first transistor is controlled by the feedback unit and the comparison unit, to stabilize voltage of an output node. When the first control unit turns on the second transistor, the voltage of the output node rises. When the first control unit turns off the second transistor, the second control unit is triggered to turn on the third transistor, so as to fully turn on the first transistor. Therefore, when third transistor turns off, first transistor can be controlled by the feedback unit and the comparison unit again to stabilize the voltage of the output node. In addition, the voltage regulator can be collaborated with a fourth transistor and a third control unit, given that the fourth transistor and the second transistor are turned on at the same time. When the third transistor turns off, the third control unit turns off the fourth transistor, causing the comparison unit to generate stabilized control voltage more promptly.

The above is merely a preferable embodiment of the present invention, and modifications and alternations in the claims of the present invention should be within the scope of the present invention.

Those skilled in the art will readily observe that numerous modifications and alterations of the device and method may be made while retaining the teachings of the invention.

What is claimed is:

1. A voltage regulator for memory, comprising:
   a first transistor, having a first end electrically connected to an input node, a second end electrically connected to an output node, and a control end;
   a feedback unit, electrically connected to the output node;
   a comparison unit, having a first input end electrically connected to the feedback unit, a second input end for receiving a reference voltage, and an output end electrically connected to the control end of the first transistor;
   a second transistor, having a first end electrically connected to the input node, a second end electrically connected to the output node, and a control end;
   a first control unit, electrically connected to the control end of the second transistor, for generating a first control signal to control the second transistor according to an input signal;
   a third transistor, having a first end electrically connected to the control end of the first transistor, a second end electrically connected to a ground end, and a control end; and
   a second control unit, electrically connected to the control end of the third transistor, for generating a second control signal to control the third transistor according to the first control signal.

2. The voltage regulator of claim 1, wherein the feedback unit comprising:
   a first resistor, having a first end electrically connected to the first end of the first transistor, and a second end electrically connected to the first input end of the comparison unit; and
   a second resistor, having a first end electrically connected to the first end of the first resistor, and a second end electrically connected to the ground end.

3. The voltage regulator of claim 1, wherein the comparison unit comprising:
   an operational amplifier, having a positive input end electrically connected to the feedback unit, a negative input end for receiving the reference voltage, and an output end electrically connected to the control end of the first transistor.

4. The voltage regulator of claim 1 further comprising:
   an inductor, having a first end electrically connected to a voltage source, and a second end electrically connected to the input node.

5. The voltage regulator of claim 1, wherein the output node electrically connected to a sensing amplifier.

6. The voltage regulator of claim 1, wherein the first and the second transistors are PMOS transistors, and the third transistor is an NMOS transistor.

7. The voltage regulator of claim 6, wherein when the first control signal rises from a low level to a high level, the second control signal rises from the low level to the high level.

8. The voltage regulator of claim 7, wherein the first control signal rises from the low level to the high level in a slope.

9. The voltage regulator of claim 1, further comprising:
a fourth transistor, having a first end electrically connected to the input node, a second end electrically connected to the output node, and a control end; and
a third control unit, electrically connected to the fourth transistor, for generating a third control signal to control the fourth transistor according to the input signal.

10. The voltage regulator of claim 9, wherein the first transistor, the second transistor, and the fourth transistor are PMOS transistors, and the third transistor is an NMOS transistor.

11. The voltage regulator of claim 10, wherein when the first control signal rises from a low level to a high level, the second control signal rises from the low level to the high level; in a predetermined period of time after the first control signal rises from the low level to the high level, the second control signal rises from the low level to the high level.

12. The voltage regulator of claim 11, wherein the first control signal rises from the low level to the high level in a slope.

13. A voltage regulator for memory, comprising:
a first transistor, having a first end electrically connected to an input node, a second end electrically connected to an output node, and a control end, the input node electrically connected to a voltage source;
a second transistor, having a first end electrically connected to the input node, a second end electrically connected to the output node, and a control end;
a digital boosting control circuit, electrically connected to the control end of the second transistor, to control the second transistor according to a first input signal; and
an analog boosting control circuit, electrically connected to the control end and the output node of the first transistor, to control the first transistor according to a second input signal and a voltage of the output node;
wherein the analog boosting control circuit controls the first transistor according to the second input signal and the voltage of the output node a predetermined time after the digital boosting control circuit turns on the second transistor according to the first input signal and then the digital boosting control circuit turns off the second transistor so that a voltage of the control end of the first transistor inclines to a first voltage level after the second input signal is triggered and to a second voltage level after the second transistor is turned off.

* * * * *